United States Patent [19]

Nagata et al.

[11] Patent Number: 5,262,398

[45] Date of Patent: Nov. 16, 1993

[54] CERAMIC OXIDE SUPERCONDUCTIVE COMPOSITE MATERIAL

[75] Inventors: Masayuki Nagata; Minoru Yokota; Ken-ichi Sato, all of Osaka, Japan

[73] Assignee: Sumitomo Electric Industries, Ltd., Osaka, Japan

[21] Appl. No.: 994,075

[22] Filed: Dec. 16, 1992

Related U.S. Application Data

[63] Continuation of Ser. No. 759,957, Sep. 17, 1991, abandoned, which is a continuation of Ser. No. 365,447, Jun. 13, 1989, abandoned, which is a continuation-in-part of Ser. No. 172,397, Mar. 24, 1988, abandoned.

[30] Foreign Application Priority Data

| Mar. 24, 1987 [JP] | Japan | 62-69366 |
| Mar. 27, 1987 [JP] | Japan | 62-74782 |
| Mar. 31, 1987 [JP] | Japan | 62-80402 |

[51] Int. Cl.$^5$ .............. C01F 11/02; C01G 3/02; B22F 3/26; H01L 39/24
[52] U.S. Cl. .................. 505/1; 419/19; 419/20; 419/22; 419/27; 505/725; 505/739; 505/785
[58] Field of Search .......... 505/1, 785, 725, 739; 252/518, 521; 75/232, 233, 234, 235; 419/19, 20, 21, 22, 27

[56] References Cited

U.S. PATENT DOCUMENTS

| 3,796,553 | 3/1974 | Daunt | 174/126.5 |
| 3,815,224 | 6/1974 | Pickus et al. | 174/126.5 |
| 3,893,821 | 7/1975 | Dames et al. | 252/521 |
| 3,951,870 | 4/1976 | Economy | 252/506 |
| 4,050,147 | 9/1977 | Winter et al. | 29/599 |
| 4,316,785 | 2/1982 | Suzuki et al. | 29/599 |
| 4,358,783 | 11/1982 | Hebard et al. | 427/62 |
| 4,412,643 | 11/1983 | Sato . | |
| 4,431,449 | 2/1984 | Dillon | 419/27 |
| 4,743,511 | 5/1988 | Sowman | 428/547 |
| 4,762,754 | 8/1988 | Nellis et al. | 428/552 |
| 4,770,701 | 9/1988 | Henderson et al. | 75/235 |
| 4,826,808 | 5/1989 | Yurek et al. | 505/1 |
| 4,834,938 | 5/1989 | Pyzik | 419/27 |
| 4,892,861 | 1/1990 | Ray | 505/1 |

FOREIGN PATENT DOCUMENTS

| 284986 | 10/1988 | European Pat. Off. . | |
| 0296380 | 12/1988 | European Pat. Off. | 505/785 |
| 085814 | 7/1981 | Japan . | |
| 0241815 | 10/1988 | Japan | 505/1 |

OTHER PUBLICATIONS

Murr et al. *Nature* vol. 329 Sep. 3, 1987, pp. 37–39.
Calabrese et al. Sesion 18: HTSC: Matenal II Abstract J84 Mar. 23, 1988.
Barrett "The Principles of Engineering Materials", Prentice-Hall, Inc., NJ.
Cava "Bulk Superconductivity at 91K in . . . $Ba_2YCu_3O_9$" *Phys. Rev. Lett.* v. 58 (16) Apr. 20, 1987 pp. 1676–1679.
C. W. Chu et al., "Evidence for Superconductivity above 40 K in the La-Ba-Cu-O Compound System," *Physical Review Letters*, vol. 58, No. 4, pp. 405–407, Jan. 26, 1987.
L. E. Murr et al., "Metal-Matrix High-Temperature Superconductor," *Advanced Materials & Processes*, vol. 132, No. 4, pp. 37–39, 42–44, Oct. 1987.
F. H. Streitz et al., "Superconducting Au-$YBa_2Cu_3O_7$ Composites," *Applied Physics Letters*, vol. 52, No. 11, pp. 927–929, Mar. 14, 1988.

(List continued on next page.)

*Primary Examiner*—Paul Lieberman
*Assistant Examiner*—John Boyd
*Attorney, Agent, or Firm*—Wegner, Cantor, Mueller & Player

[57] ABSTRACT

A ceramic oxide superconductive composite material comprising a ceramic oxide superconductor and a non-superconductive material comprising at least one element which does not react with any of the elements of the ceramic oxide superconductor has improved superconductive properties such as a higher critical temperature and a larger critical current density.

2 Claims, 1 Drawing Sheet

OTHER PUBLICATIONS

M. K. Wu, et al., "Superconductivity at 93 K in a New Mixed-Phase Y-Ba-Cu-O Compound System at Ambient Pressure," *Physical Review Letters,* vol. 58, No. 9, pp. 908-910, Mar. 2, 1987.

S. Jin et al., "Large Magnetic Hysteresis in a Melt-Textured Y-Ba-Cu-O Superconductor," *Appl. Phys. Lett.,* vol. 54, No. 6, May 2, 1988, pp. 584-586.

M. K. Malik et al., "Texture Formation and Enhanced Critical Currents in $YBa_2CU_3O_7$," *Appl. Phys. Lett.,* vol. 52, No. 18, May 2, 1988, pp. 1525-1527.

Gleick, James "Breakthrough Seen in Magnet Research" *New York Times* Mar. 18, 1987.

"The Superconductor Comes in from the Cold", *The Economist* Feb. 21, 1987, pp. 87-88.

Wu et al. *Physical Review Letters* vol. 58, No. 9 pp. 908-910 Mar. 2, 1987.

Moiseev et al. *Sov. J. Low Temp. Physics.* vol. 13 No. 6 Jun. 1987.

McCallium et al. *Advanced Ceramic Materials* vol. 2, No. 3B Special Issue Jul. 1987 pp. 388-400.

Yurek et al. *Journal of The Electrochemical Society* vol. 134, No. 10, Oct. 1987, pp. 2635-2636.

Sheng et al. *Applied Physics Letters,* vol. 52 No. 20 May 16, 1988 pp. 1738-1740.

Hill et al. *Applied Physics Letters,* vol. 53, No. 17 Oct. 24, 1988, pp. 1657-1659.

Togano et al. *Materials Research Society Int'l Meeting on Advanced Materials* Sunshine City, Ikebukoro, Kokyo, Japan May 30-Jun. 3, 1988.

Politz et al. *Modern Physics Letters B.,* vol. 2, No. 9 (1988, Oct.) pp. 1119-1123.

Richardson, Applied Physics Letters vol. 53, No. 23, Dec. 5, 1988, pp. 2342-2343.

Tai et al. *Japanese Journal of Applied Physics* vol. 27, No. 12, Dec. 1988, pp. 22287-22288.

Markert et al. *Solid State Communications* vol. 70, No. 2 Apr. 1989, pp. 145-147.

Matsumoto et al. *Materials Research Bulletin,* vol. 24, Dec. 1989 pp. 1469-1475.

CA 106(22): 187564; Abstract of JP61227306 Oct. 1986 (Takei).

CA 106(14): 112321u Abstract of JP61231143 Oct. 1986 (Takei).

CA 106(14): 112319z abstract of JP61224213 Mar. 1985 (Takei).

Escudero et al., *Japanese Journal of Applied Physics* vol. 26, No. 6, Jun. 1987, pp. L1019-L1020.

Chu et al, *Physical Review Letters* vol. 60, No. 10 Mar. 7, 1988, pp. 941-943.

Hazen et al. *Physical Review Letters* vol. 60, No. 16 Apr. 18, 1988, pp. 1657-1659.

Goual et al *Materials Letters* vol. 6, No. 8.9 May 1988 pp. 257-260.

Jin et al. *Applied Physics Letters* vol. 52, No. 19 May 9, 1988 pp. 1628-1630.

CERAMIC OXIDE SUPERCONDUCTIVE COMPOSITE MATERIAL

RELATED APPLICATION

This application is a continuation of U.S. application Ser. No. 07/759,957 filed Sep. 17, 1991, which is a continuation of Ser. No. 07/365,447 filed Jun. 13, 1989 now abandoned, which is a continuation-in-part application to Ser. No. 172,397 filed on Mar. 24, 1988 now abandoned.

BACKGROUND OF THE INVENTION

1. Field of the Invention

The present invention relates to a ceramic oxide superconductive composite material which comprises a ceramic oxide superconductor and a non-superconductive material comprising at least one element which does not react with any of the elements of the ceramic oxide superconductor. More particularly, it relates to a ceramic oxide superconductive composite material having a new construction whereby the ceramic oxide superconductor having a higher superconductive critical temperature can be effectively utilized.

2. Description of Related Art

A superconductor exhibits complete diamagnetism under superconductive conditions and has no potential difference therein in spite of flow of stationary current in therein. By using this characteristic of the superconductor, many applications of superconductors as mediums for electric current have been proposed.

Application fields of superconductor include versatile technical fields such as an electric power field (e.g. MHD power generation, power transmission, energy storage, etc.), a motive power field (e.g. linear motor (magnetic levitation) trains, electromagnetic propulsion ships, etc.), and a measuring field in which the superconductor is used as a highly sensitive sensor for a magnetic field, a microwave, radiation and the like (e.g. NMR, therapy using $\eta$-meson, high energy physical experiment apparatus, etc.).

In addition, in the electronics including a Josephson element, the superconductor is expected to provide an element which can not only decrease power consumption but also work at a very high speed.

The superconductive phenomenon has been found in specific metals or organic compounds at extremely low temperatures. Namely, among classical superconductors, $Nb_3Ge$ is said to have the highest critical temperature Tc for superconductivity of 23.2K and this temperature has been considered as the upper limit of Tc for a long time.

Hitherto, to realize the superconductive phenomenon, a superconductor should be cooled to a temperature lower than Tc with liquid helium which has a boiling point of 4.2K. However, the use of liquid helium greatly increases technical burden and cost because of necessity of a cooling system including an apparatus for liquefying helium, which prevents practical application of the superconductor.

Recently, it was reported that a sintered material comprising oxides of elements of IIa or IIIa group of the periodic table can act as a superconductor at a high critical temperature and is expected to accelerate practical application of superconductor technology. From already available reports, compound oxides having a crystal structure similar to the perovskite crystal structure such as $(La,Ba)_2CuO_4$ or $(La,Sr)_2CuO_4$ are known as superconductors having high Tc. These compound oxides have Ic of 30 to 50 K, which is far higher than that of the classical superconductors. In addition, a Ba-Y-Cu type superconductor is reported to have Tc higher than the liquid nitrogen temperature although its structure has not been identified.

Since the ceramic oxide superconductor is prepared by sintering powdery metal compounds as raw materials, it is inevitably porous. Due to porosity, the ceramic oxide superconductor has various drawbacks such that (a) an amount of electric current which can flow through the superconductor is small, namely a current density is small, (b) the superconductor has low mechanical strength and easily broken, and (c) if water is trapped in pores, hydroxide groups of water react with the material to deteriorate the superconductor.

It is known that the presence of oxygen in a sintering atmosphere greatly influences properties of superconductor in the preparation of ceramic oxide superconductor. For example, the raw materials are sintered in the air, a surface part of sintered material, for example, a surface layer of thickness of 0.5 mm from the surface which readily contacts the air has superior superconductive characteristics, namely higher critical temperature than inner parts of sintered material, although non-surface parts of sintered material may have superconductive characteristics.

In view of strength, the ceramic oxide superconductor which is prepared as a sintered material is usually brittle and requires great care to handle. That is, the ceramic oxide superconductor is easily broken or cracked by mechanical stress. Particularly, the ceramic oxide superconductor in the form of a wire is very easily broken. When the raw materials are formed in a porous state or a three-dimensional network to increase a surface area so as to make use of oxygen supply on the surface during sintering and to achieve desired superconductive characteristics, the sintered product becomes more fragile and its mechanical strength further decreases. Accordingly, it is practically difficulty not only to plastically work the ceramic oxide superconductor but also to simply form. Therefore, its practical use has severe limitation.

Furthermore, it is very difficult to form a sintered superconductor from homogeneous polycrystal consisting of particles all having superconductive characteristics and, as a general property of the superconductor, the superconductive state may be locally broken by change of external magnetic field or cooling temperature. The ceramic oxide superconductor has smaller thermal conductivity and larger electrical resistance than the classical superconductors. Therefore, when the superconductive state is locally broken, such part of the superconductor is locally heated by electrical current which flows through the superconductor. If the cooling medium contacts the locally heated part of superconductor, it is explosively vaporized.

To prevent such explosive vaporization, the classical metal superconductor is processed in the form of a thin filament and a plural number of filaments are bundled by a good conductive material such as copper, which acts as a thermal conductor and a by-pass of electric current in case of breakage of superconductive state. However, it is difficult to process the ceramic oxide superconductor having higher Tc in the form of filament.

SUMMARY OF THE INVENTION

One object of the present invention is to provide a ceramic oxide superconductor having improved mechanical strength, stability, higher Tc and larger critical current density.

Another object of the present invention is to provide a ceramic oxide superconductor which is thermally stable and hardly suffers from breakage of superconductive state even in the form of a wire.

Accordingly, the present invention provides a ceramic oxide superconductive composite material comprising a ceramic oxide superconductor and a non-superconductive material comprising at least one element which does not react with any of the elements of the ceramic oxide superconductor.

DETAILED DESCRIPTION OF THE INVENTION

Figure 1:
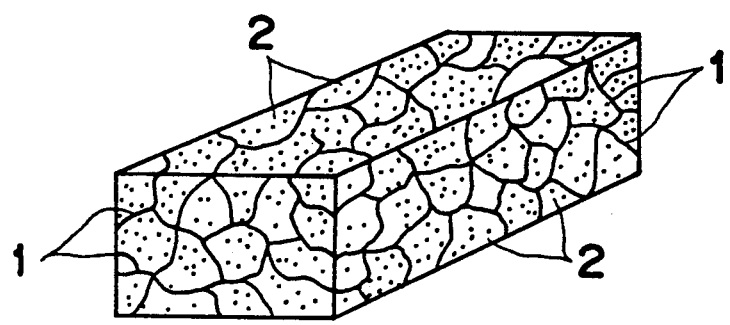
FIG. 1 is a perspective view of one embodiment of a ceramic oxide superconductive composite material according to the present invention.

The ceramic oxide superconductor includes an oxide having a composition of the formula:

$$LnBa_2Cu_3O_y$$

wherein Ln is Y, La, Nd, Pm, Sm, Eu, Gd, Dy, Ho, Er, Tm or Yb;

$$(La_{1-x}Sr_x)_2CuO_4$$

wherein x is larger than 0 and smaller than 1;

$$(La_{1-x}Ba_x)_2CuO_4$$

wherein x is larger than 0 and smaller than 1;

$$Tl_2Ba_2Ca_{m-1}Cu_mO_y$$

wherein m is an integer of 1 to 4;

$$TlBa_2Ca_{n-1}Cu_nO_y$$

wherein n is an integer of 1 to 6:

$$TlSr_2CaCu_2O_y;$$

$$TlSr_2Ca_2Cu_3O_y;$$

$$(Tl,Bi)Sr_2CaCu_2O_7;$$

$$Tl_{0.5}Pb_{0.5}Sr_2CaCu_2O_7;$$

$$Tl_{0.5}Pb_{0.5}Sr_2Ca_2Cu_3O_9;$$

$$(TlY)_2Ba_2CaCu_2O_y;$$

$$(TlY)_2Ba_2Ca_2Cu_3O_y;$$

$$Bi_2Sr_2Ca_{z-1}Cu_zO_y$$

wherein z is an integer of 1 to 3;

$$(Bi_{1-w}Pb_w)_2Sr_2Ca_{z-1}Cu_zO_y$$

wherein w is not smaller than 0 and not larger than 0.3 and z is the same as difiend above;

$$(Nd_{1-a}Sr_{a-b}Ce_b)_2CuO_4$$

wherein a is larger than 0 and smaller than 1 and b is larger than 0 and smaller than 1; and $$(NdCe)_2CuP_4.$$

In the Bi-system oxide, a part of Bi sites may be replaced with Sr and/or Ca, and the atomic ratio of the elements is not strictly a ratio of integer numbers. Rather, ±10% deviation of the composition can be allowed.

The group of the non-superconductive material includes ferromagnetic materials and paramagnetic materials. Examples of the ferromagnetic materials are Gd, Tb, Dy, Ho, Er, Tm, Fe, Ni anc Co. Examples of the paramagnetic materials are Au, Pt, Ag, $Ag_2O$ and Pb.

The ferro- or para-magnetic material can be incorporated in the pores of the superconductor by sintering the superconductor component materials and the ferro- or paramagnetic material at a temperature between a melting point of such materials and the sintering temperature. An elevated pressure in the sintering step is preferred to impregnate the materials.

The weight ratio of the ferro- or para-magnetic material to the superconductor is from 1:1 to 1:9, preferably from 1:2 to 1:7.

When the ferromagnetic material is incorporated in the pores of the superconductor, it acts as a pinning point so that the critical current density increases since the magnetic flux tends to be gathered by the ferromagnetic material. When the paramagnetic material is composited with the superconductor, an interface between the superconductor matrix and the paramagnetic material acts as a pinning point and also electromagnetically stabilizes the superconductor.

Another example of the non-superconductive material is a stabilizing material. The stabilizing material stabilizes the superconductive properties of the superconductor and comprises copper, aluminum, copper which contains aluminum dispersed therein or a copper-nickel alloy. Among them, copper and aluminum, particularly aluminum having purity of 99.99% or higher are preferred.

The stabilizing material can be filled in the pores of the superconductor by immersing the sintered oxide superconductor in the molten stabilizing material such as aluminum. Another process for making the composite comprises filling a solder and the stabilizer in the pores.

The weight ratio of the stabilizing material to the superconductor is from 1:1 to 1:9, preferably from 1:2 to 1:7.

The stabilizing material is filled in pores of the ceramic oxide superconductor. Although the ceramic oxide superconductor which is produced by sintering is porous, it is possible to form a thin film of superconductor on cell wall and/or outer surfaces of a resin foam so as to increase porosity of the superconductor. A typical method for producing such porous superconductor will be explained below.

In the cells and/or on the outer surfaces of a foam of thermoplastic resin such as polyurethane, polyethylene, polypropylene and polystyrene, preferably a foam having open cells or a porously formed copper body, a solution of a superconductor forming raw material (preferably alcoholate) which has been prepared by a so-called sol-gel method is applied, dried and sintered in the air. Then, the resin or copper is removed by melting or burning it. The remaining superconductor formed from the raw material present in the cells has relatively larger porosity and of desired shape.

Since the thus formed superconductor has a larger surface area and is supplied with a larger amount of oxygen during sintering, it has better superconductive properties such as higher Tc.

The stabilizing material in a melt state is then filled in the pores of the porous superconductor. The produced superconductor has a structure shown in FIG. 1 which comprises a porous superconductor 1 and a stabilizing material 2 filled in the pores.

Figure 2:
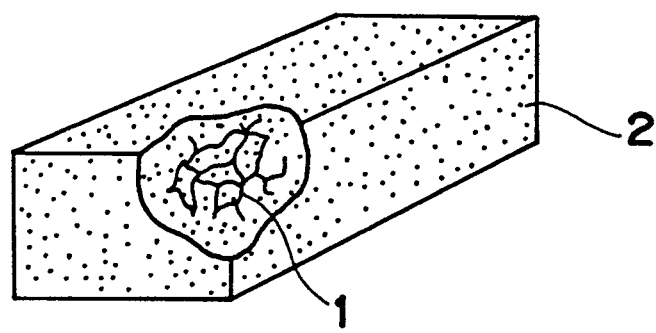
FIG. 2 is a partly cut out perspective view of another embodiment of a ceramic oxide superconductive composite material according to the present invention.

FIG. 2 shows another embodiment of the stabilizing material filled superconductor. In this embodiment, the stabilizing material 2 is not only filled in the pores but also coated on the outer surfaces of the superconductor 1. Accordingly, the superconductor is embedded in the stabilizing material so that protection and strength of the superconductor 1 are improved.

PREFERRED EMBODIMENTS OF THE INVENTION

The present invention will be illustrated by following Examples.

EXAMPLE 1

$Y_2O_3$ powder (3.78 g), $BaCO_3$ powder (13.22 g) and CuO powder (7.99 g) were sintered in the air at 940° C. for 24 hours. The prepared superconductor material was immersed in melt lead kept at 400° C. to fill the pores of superconductor with lead to produce a non-porous superconductive composite material.

The non-porous superconductive composite material had a Tc of 90K, which is substantially the same as that of the superconductor which was not filled with lead. The critical current density of the non-porous superconductive composite material was 50 $A/cm^2$ while that of the superconductor which was not filled with lead was 10 $A/cm^2$. Further, the strength of non-porous superconductive composite material was improved and not broken during handling. The superconductive properties were not changed when contacted with moisture.

EXAMPLE 2

$Y_2O_3$ powder (3.78 g), $BaCO_3$ powder (13.22 g), CuO powder (7.99 g) and metal iron powder (4.50 g) were sintered in the air at 940° C. for 24 hours.

The produced iron-filled superconductive composite material had less porosity and better strength than a superconductor containing no iron, and its critical current density was 100 $A/cm^2$.

EXAMPLE 3

$Y_2O_3$ powder (3.78 g), $BaCO_3$ powder (13.22 g), CuO powder (7.99 g) and metal silver powder (33.5 g) were sintered in the air at 940° C. for 24 hours.

The silver-filled superconductive composite material had a Tc of 92K, which is substantially the same as that of the superconductor which was not filled with silver. The critical current density of the silver-filled superconductive composite material was 20 $A/cm^2$ which was at least 10 times larger than that of the superconductor which was not filled with silver.

In addition, to the surface of the silver-filled superconductor, a lead wire and the like was easily bonded.

When the superconductive state was broken, the material was not broken. It had very small electric resistance and was electromagnetically stable.

EXAMPLE 4

Ethanol (200 ml) and octyl alcohol (50 ml) were added to 1 (one) mole of yttrium isopropoxide. To the mixture, ethanol (100 ml) containing 2 moles of barium ethoxide was added and mixed. To the resulting solution, water (2.7 mole) and a mixed solution of nitric acid and ethanol containing copper acethylacetonato (200 ml) were gradually added. Then, the mixture was heated and refluxed for 3 hours. The resulting sol solution was applied on surfaces of a porous body made of polyurethane foam and slowly dried. When it was dried in the air at room temperature for about 10 days and then at about 900° C. for 10 hours, the polyurethane foam was completely burnt out to leave a porous oxide superconductor material which might comprise $YBa_2Cu_3O_x$. Its onset temperature was about 100K and it became completely superconductive at about 83K.

When the same mixture of raw materials was applied on a solid copper material and dried in the same manner as above, the produced superconductor became completely superconductive at about 60K.

From the above results, the superconductor produced by supplying enough oxygen had better superconductive properties.

As understood from the above description, since the pores of the superconductor of the present invention is filled with a certain material, it has sufficient compression strength, water resistant and higher critical temperature.

Since the porosity is decreased and in turn the density is increased, overall specific heat is increased and stable against thermal disturbance. Therefore, an element such as a superconductive magnet has improved reliance and is easily used.

Since it is difficult to adhere a solder or to adhere a piece of metal to the conventional superconductor itself, it is very hard to form a terminal for achieving a high current density. For example, as a current lead or a voltage terminal, a silver past which is less reliable is conventionally used. However, according to the present invention, a piece of metal can be adhered to the ferro-magnetic material, paramagnetic material and stabilizing material by, for example, soldering. Therefore, no heat is generated by the terminal and high current density can be achieved.

When the superconductor of the present invention is processed in the form of a wire, the filled stabilizing material acts as a by-pass for electric current, so that the thermal stability of the wire is improved.

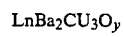

What is claimed is:

1. A method for producing a ceramic oxide superconductive composite material comprising immersing a porous body of an oxide superconductor in a melt of at least one metal selected from the group consisting of aluminum and lead.

2. The method of claim 1, wherein said oxide superconductor has a composition formula:

$$LnBa_2CU_3O_y$$

wherein Ln is Y, La, Nd, Pm, Sm, Eu, Gd, Dy, Ho, Er, Tm or Yb.